United States Patent
Hirayama

(10) Patent No.: US 9,075,303 B2
(45) Date of Patent: Jul. 7, 2015

(54) OPTICAL WAVEGUIDE FORMING EPOXY RESIN COMPOSITION, CURABLE FILM FORMED FROM THE EPOXY RESIN COMPOSITION FOR FORMATION OF OPTICAL WAVEGUIDE, AND LIGHT TRANSMISSION FLEXIBLE PRINTED BOARD

(71) Applicant: NITTO DENKO CORPORATION, Ibaraki-shi, Osaka (JP)

(72) Inventor: Tomoyuki Hirayama, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 13/785,291

(22) Filed: Mar. 5, 2013

(65) Prior Publication Data

US 2013/0236149 A1    Sep. 12, 2013

(30) Foreign Application Priority Data

Mar. 12, 2012  (JP) ................................. 2012-054324

(51) Int. Cl.

| | |
|---|---|
| G03F 7/004 | (2006.01) |
| G02B 6/02 | (2006.01) |
| C08L 63/00 | (2006.01) |
| C08G 59/24 | (2006.01) |
| G02B 1/04 | (2006.01) |
| G03F 7/038 | (2006.01) |
| G02B 6/12 | (2006.01) |

(52) U.S. Cl.
CPC ............ *G03F 7/004* (2013.01); *G02B 6/02033* (2013.01); *G02B 2006/12073* (2013.01); *C08L 63/00* (2013.01); *C08G 59/245* (2013.01); *G02B 1/046* (2013.01); *G02B 1/048* (2013.01); *G03F 7/038* (2013.01)

(58) Field of Classification Search
CPC ........... G02B 2006/12069; G02B 2006/12071; G02B 2006/12073; G02B 2006/12076
USPC .................................................. 385/143, 145
See application file for complete search history.

(56) References Cited

U.S. PATENT DOCUMENTS

| | | | | |
|---|---|---|---|---|
| 2005/0201714 | A1* | 9/2005 | Mune et al. ................... | 385/143 |
| 2007/0223868 | A1* | 9/2007 | Utaka et al. ................... | 385/127 |
| 2012/0033913 | A1 | 2/2012 | Kondou et al. | |
| 2012/0283352 | A1* | 11/2012 | Nohara et al. ................. | 522/166 |
| 2012/0326301 | A1 | 12/2012 | Wakioka et al. | |

FOREIGN PATENT DOCUMENTS

| | | |
|---|---|---|
| EP | 2487193 A1 | 8/2012 |
| JP | 2007093856 A * | 4/2007 |
| JP | 2008009150 A * | 1/2008 |
| JP | 2010-230944 A | 10/2010 |
| JP | 2011-27903 A | 2/2011 |
| WO | 2010/110495 A1 | 9/2010 |
| WO | 2011/043288 A1 | 4/2011 |
| WO | 2011/090038 A1 | 7/2011 |

OTHER PUBLICATIONS

Extended European Search Report dated Aug. 14, 2013, issued in corresponding European Patent Application No. 13157787.6 (6 pages).

* cited by examiner

*Primary Examiner* — Charlie Y Peng
(74) *Attorney, Agent, or Firm* — Westerman, Hattori, Daniels & Adrian, LLP

(57) ABSTRACT

An excellent optical waveguide forming epoxy resin composition is provided, comprising:
(A) a liquid epoxy resin;
(B) a solid resin; and
(C) a photoacid generator;
wherein the liquid epoxy resin (A) comprises a liquid epoxy resin represented by the following general formula (1) as a major component thereof in a proportion of 50 to 80 wt % based on an overall amount of a resin component of the resin composition:

(1)

wherein $R_1$ and $R_2$ are each a hydrogen atom or a methyl group; $R_3$ to $R_6$ are each a hydrogen atom, a methyl group, a chlorine atom or a bromine atom; X is a $C_2$ to $C_{15}$ alkylene group, an ethyleneoxy group, a di(ethyleneoxy) group, a tri (ethyleneoxy) group, a propyleneoxy group, a propyleneoxypropyl group, a di(propyleneoxy) propyl group or a tri(propyleneoxy)propyl group; and n is a natural number and has an average value of 1.2 to 5.

8 Claims, No Drawings

OPTICAL WAVEGUIDE FORMING EPOXY RESIN COMPOSITION, CURABLE FILM FORMED FROM THE EPOXY RESIN COMPOSITION FOR FORMATION OF OPTICAL WAVEGUIDE, AND LIGHT TRANSMISSION FLEXIBLE PRINTED BOARD

BACKGROUND OF THE INVENTION

1. Field of the Invention

The present invention relates to an optical waveguide forming epoxy resin composition to be used as a material for a cladding layer of an optical waveguide of an optical waveguide apparatus widely used for optical communications, optical information processing and other general optics.

2. Description of the Related Art

Optical waveguide cladding materials for light transmission flexible printed boards are required to have high flexibility, low refractive index and excellent patternability. In designing a material satisfying such requirements, an aliphatic resin is typically selected for the lower refractive index, and a multi-functional aliphatic epoxy resin and a long-chain bi-functional aliphatic epoxy resin are blended as required to impart the material with excellent patternability (high sensitivity) and high flexibility. For a cladding material particularly required to have higher flexibility, therefore, the amount of the long-chain bi-functional aliphatic epoxy resin is inevitably increased, so that the cladding material tends to have a lower glass transition temperature Tg after being cured (see, for example, JP-A-2011-27903 and JP-A-2010-230944).

In a roll-to-roll process for mass production, on the other hand, a dry film technique is generally employed, in which an uncured film is used in the form of a dry film material. In order to adapt the dry film material for the roll-to-roll process, the uncured material is required to have lower tackiness and flexibility. In development of the material, however, these requirements reduce the material design flexibility. In production of the dry film, it is necessary to provide laminate substrates on opposite surfaces of the dry film, resulting in problems associated with resource saving and cost saving. In the material development, it is also important to adapt the material for a wet process in which a liquid material is applied onto a substrate for formation of a clad and a core (JP-A-2010-230944).

In the wet process, a surface smoothing agent (leveling agent) is added to the material or a solvent having a higher boiling point is used to increase the surface smoothness of the coating film in a coating film forming and solvent drying step.

However, the addition of the leveling agent reduces the surface tension of the surface of the coating film, resulting in repellency in the subsequent coating film forming step. This often adversely influences a waveguide loss.

Where the higher boiling point solvent is used instead of the leveling agent, on the other hand, the following problem will be encountered. Where a cladding material imparted with the flexibility and hence having a reduced glass transition temperature Tg is used, a core resin component is liable to infiltrate into the resulting under-cladding film due to the drying of the higher boiling point solvent in a core layer forming and drying step in which a core layer is formed on the under-cladding film. Therefore, light propagating through the core layer is liable to leak into the under-cladding film, thereby increasing the waveguide loss.

With such technical background, there is an eager demand for a cladding material having a higher glass transition temperature Tg, higher flexibility and excellent patternability for formation of a cladding layer.

SUMMARY OF THE INVENTION

An excellent optical waveguide forming epoxy resin composition is provided, as an optical waveguide forming material, particularly, as a cladding layer forming material, which ensures a higher glass transition temperature Tg, higher flexibility and excellent patternability.

According to a first aspect, there is provided an optical waveguide forming epoxy resin composition comprising:

(A) a liquid epoxy resin;

(B) a solid resin; and (C) a photoacid generator;

wherein the liquid epoxy resin (A) comprises a liquid epoxy resin represented by the following general formula (1) as a major component thereof in a proportion of 50 to 80 wt % based on the overall amount of a resin component of the resin composition:

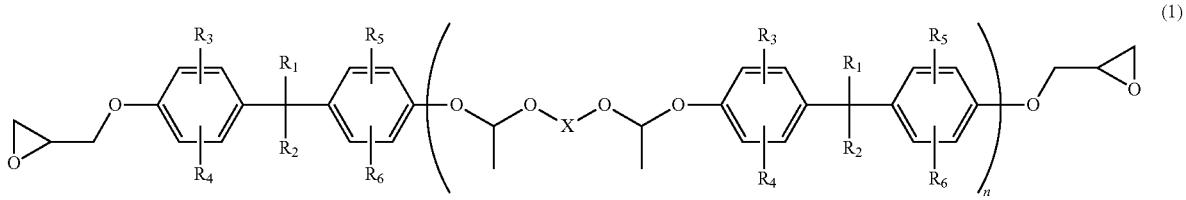

wherein $R_1$ and $R_2$ are each a hydrogen atom or a methyl group; $R_3$ to $R_6$ are each a hydrogen atom, a methyl group, a chlorine atom or a bromine atom; X is a $C_2$ to $C_{15}$ alkylene group, an ethyleneoxy group, a di(ethyleneoxy) group, a tri(ethyleneoxy) group, a propyleneoxy group, a propyleneoxypropyl group, a di(propyleneoxy)propyl group or a tri(propyleneoxy)propyl group; and n is a natural number and has an average value of 1.2 to 5.

According to a second aspect, there is provided an optical waveguide forming curable film formed from the optical waveguide forming epoxy resin composition. According to a third aspect, there is provided a light transmission flexible printed board including a clad or a core which is formed by curing the optical waveguide forming epoxy resin composition or the optical waveguide forming curable film.

The an optical waveguide forming epoxy resin composition ensures a higher glass transition temperature Tg, higher flexibility and excellent patternability for use as a material for formation of an optical waveguide cladding layer. Where the liquid epoxy resin to be blended contains the liquid epoxy resin represented by the above general formula (1) as the major component thereof in the predetermined proportion, the aforementioned object is achieved.

There are contradictory characteristic properties of an aliphatic long-chain bi-functional epoxy resin and an aromatic long-chain bi-functional epoxy resin, i.e., the fact that the aliphatic long-chain bi-functional epoxy resin has a reduced refractive index and is contributory to the impartment of flexibility but significantly reduces the glass transition temperature Tg and the fact that the aromatic long-chain bi-functional epoxy resin has an increased refractive index and is less contributory to the impartment of the flexibility but moderately reduces the glass transition temperature Tg. Where a semi-aliphatic skeleton is introduced into a liquid long-chain epoxy resin contributory to the impartment of the flexibility and the resulting epoxy resin is blended in a specific proportion, it is possible to impart the resulting material with satisfactory flexibility as well as with a higher glass transition temperature Tg than the conventional aliphatic long-chain bi-functional epoxy resin while suppressing the increase in refractive index.

As described above, the optical waveguide forming epoxy resin composition is provided comprising the aforementioned components (A) to (C), wherein the liquid epoxy resin (A) comprises the liquid epoxy resin represented by the above general formula (1) as the major component thereof in a proportion of 50 to 80 wt % based on the overall amount of the resin component of the resin composition. Therefore, a higher glass transition temperature Tg, higher flexibility and excellent patternability are ensured, for example, when a clad or a core of an optical waveguide is formed from the optical waveguide forming epoxy resin composition.

In the wet process, the use of a film formed by curing the optical waveguide forming epoxy resin composition makes it possible to form the core without infiltration of the core resin component in the clad.

The clad or the core formed by curing the optical waveguide forming epoxy resin composition has a higher glass transition temperature Tg, higher flexibility (flex resistance) and excellent patternability. Further, the light transmission flexible printed board is provided which includes the optical waveguide including the core or the clad thus formed.

DETAILED DESCRIPTION OF THE INVENTION

Next, the present invention will be described in detail by way of embodiments thereof. It should be understood that the invention be not limited to these embodiments.

<<Optical Waveguide Forming Epoxy Resin Composition>>

The optical waveguide forming epoxy resin composition includes a liquid epoxy resin (A), a solid resin (B) and a photoacid generator (C), wherein the liquid epoxy resin (A) comprises a specific component as a major component thereof in a specific proportion. The term "liquid" or "solid" means a liquid state or a solid state observed at a temperature of 25° C. The components (A) to (C) will hereinafter be described one by one.

The liquid epoxy resin (A) is a compound including a liquid epoxy resin represented by the following general formula (1) as a major component thereof. The term "major component" means a principal component constituting substantially the entire compound and based on not only the use amount but also the capability of influencing the physical properties and the characteristic properties of the entire compound. Specifically, the major component accounts for the majority of the liquid epoxy resin, and the liquid epoxy resin may contain only the major component.

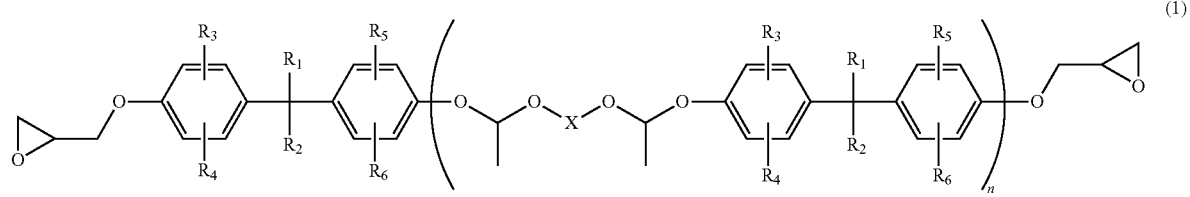

(1)

wherein $R_1$ and $R_2$ are each a hydrogen atom or a methyl group; $R_3$ to $R_6$ are each a hydrogen atom, a methyl group, a chlorine atom or a bromine atom; X is a $C_2$ to $C_{15}$ alkylene group, an ethyleneoxy group, a di(ethyleneoxy) group, a tri(ethyleneoxy) group, a propyleneoxy group, a propyleneoxypropyl group, a di(propyleneoxy)propyl group or a tri(propyleneoxy)propyl group; and n is a natural number and has an average value of 1.2 to 5.

In the above formula (1), $R_1$ and $R_2$ are each a hydrogen atom or a methyl group, preferably a methyl group. $R_3$ to $R_6$ are each a hydrogen atom, a methyl group, a chlorine atom or a bromine atom, preferably a hydrogen atom. X is a $C_2$ to $C_{15}$ alkylene group, an ethyleneoxy group, a di(ethyleneoxy) group, a tri(ethyleneoxy) group, a propyleneoxy group, a propyleneoxypropyl group, a di(propyleneoxy)propyl group or a tri(propyleneoxy)propyl group. Further, n is a natural number and has an average value of 1.2 to 5.

Where the resin composition is in the form of a solution obtained by dissolving the constituents in an organic solvent, for example, the liquid epoxy resin represented by the above formula (1) is present in a proportion of 50 to 80 wt %, preferably 60 to 70 wt %, based on the overall amount of the resin component of the optical waveguide forming epoxy resin composition. If the proportion of the specific liquid epoxy resin is excessively small, the resulting optical waveguide has a significant linear loss. Further, it is difficult to provide a desired (highly sensitive) optical waveguide because of poorer patternability. If the proportion of the specific liquid epoxy resin is excessively great, on the other hand, the resulting optical waveguide has a greater bend loss and poorer flexibility. The resin component may include other resin in addition to the resins (A) and (B), but preferably includes only the resins (A) and (B).

For the optical waveguide forming epoxy resin composition, other liquid epoxy resin may be used, as required, in addition to the specific liquid epoxy resin.

Specific examples of the other liquid epoxy resin include a liquid bisphenol-A epoxy resin, a liquid bisphenol-F epoxy resin, a liquid hydrogenated bisphenol-A epoxy resin, a liquid 3,4-epoxycyclohexenylmethyl-3',4'-epoxycyclohexene carboxylate and a liquid 3,4-epoxycyclohexenylmethyl-3',4'-epoxycyclohexene carboxylate modified with ε-caprolactone, which may be used either alone or in combination. These compounds may be synthesized with reference to conventionally known techniques, or commercially available products may be bought for preparation of these compounds. Examples of the commercially available products include JER828 (available from Mitsubishi Chemical Corporation), EPICLON 830S (available from DIC Corporation), YX8000 (available from Mitsubishi Chemical Corporation), CELLOXIDE 2021P (available from Daicel Chemical Industries, Ltd.), CELLOXIDE 2081 (available from Daicel Chemical Industries, Ltd.) and PG-207N (available from Nippon Steel Chemical Co., Ltd.) Particularly, PG-207N is preferred.

The solid resin (B) is a resin which assumes a solid state at a temperature of 25° C., and may be reactive or nonreactive with the liquid epoxy resin (A).

Specific examples of the reactive solid resin include a solid 1,2-epoxy-4-(2-oxiranyl)cyclohexane adduct of 2,2-bis(hydroxymethyl)-1-butanol, a solid bisphenol-A epoxy resin, a solid bisphenol-F epoxy resin and a solid hydrogenated bisphenol-A epoxy resin, which may be used either alone or in combination. Specific examples of the nonreactive solid resin include polyvinyl acetal resins (S-LEK BM-1 and BM-S available from Sekisui Chemical Co., Ltd.), which may be used either alone or in combination. These compounds may be synthesized with reference to conventionally known techniques, or commercially available products may be bought for preparation of these compounds. Examples of the commercially available products for the reactive solid resins include EHPE 3150 (available from Daicel Chemical Industries, Ltd.), EPICOAT 1007 (available from Mitsubishi Chemical Corporation), EPICOAT 4007 (available from Mitsubishi Chemical Corporation) and YL7170 (available from Mitsubishi Chemical Corporation). Examples of the commercially available products for the nonreactive solid resins include S-LEK BM-1 and BM-S (available from Sekisui Chemical Co., Ltd.)

The photoacid generator (C) is blended in the optical waveguide forming epoxy resin composition in order to impart the epoxy resin composition with photo-curability, e.g., UV-curability.

Examples of the photoacid generator (C) include photopolymerization initiators such as benzoins, benzoin alkyl ethers, acetophenones, aminoacetophenones, anthraquinones, thioxanthones, ketals, benzophenones, xanthones and phosphine oxides. Specific examples of the photopolymerization initiators include triphenylsulfonium antimony hexafluoride, 2,2-dimethoxy-1,2-diphenylethan-1-one, 1-hydroxycyclohexyl phenyl ketone, 2-hydroxy-2-methyl-1-phenylpropan-1-one, 1-[4-(2-hydroxyethoxy)phenyl]-2-hydroxy-2-methyl-1-propane, 2-hydroxy-1-{4-[4-(2-hydroxy-2-methylpropionyl)benzyl]phenyl}-2-methylpropan-1-one, 2-benzyl-2-dimethylamino-1-(4-morpholinophenyl)-butanone-1, 2-methyl-1-(4-methylthiophenyl)-2-morpholinopropan-1-one, bis(2,4,6-trimethylbenzoyl)phenylphosphine oxide, 2,4,6-trimethylbenzoyldiphenylphosphine oxide, bis(n5-2,4-cyclopentadien-1-yl)-bis[2,6-difluoro-3-(1H-pyrrol-1-yl)phenyl]titanium and 2-hydroxy-1-{4-[4-(2-hydroxy-2-methylpropionyl)benzyl]phenyl}-2-methylpropan-1-one, which may be used either alone or in combination. Among these compounds, triphenylsulfonium antimony hexafluoride, 2,2-dimethoxy-1,2-diphenylethan-1-one, 1-hydroxycyclohexyl phenyl ketone and 2-hydroxy-1-{4-[4-(2-hydroxy-2-methylpropionyl)benzyl]phenyl}-2-methylpropan-1-one are preferred.

The proportion of the photoacid generator (C) is preferably 0.1 to 10 parts by weight, more preferably 0.5 to 5 parts by weight, particularly preferably 1 to 3 parts by weight, based on 100 parts by weight of the resin component of the optical waveguide forming epoxy resin composition. If the proportion of the photoacid generator is excessively small, it is difficult to provide satisfactory photo-curability by irradiation with ultraviolet radiation. If the proportion of the photoacid generator is excessively great, the photosensitivity is increased, resulting in abnormal pattern configuration and shorter pot life of varnish.

As required, the optical waveguide forming epoxy resin composition may contain an additive in addition to the liquid epoxy resin (A), the solid resin (B) and the photoacid generator (C). Examples of the additive include a silane or titanium coupling agent for increasing the adhesiveness, an olefin oligomer, a cycloolefin oligomer or polymer such as a norbornene polymer, a synthetic rubber, a silicone compound or other flexibilizer, an antioxidant and a defoaming agent. These additives are each blended in a proportion that does not impair the effects of the present invention. These additives may be used either alone or in combination.

The optical waveguide forming epoxy resin composition may be provided in the form of a varnish to be used for coating by dissolving the constituents described above in an organic solvent blended in a proportion that does not impair the effects of the present invention. Examples of the organic solvent include methyl ethyl ketone, cyclohexanone, ethyl lactate, 2-butanone, N,N-dimethylacetamide, diglyme, diethylene glycol methyl ethyl ether, propylene glycol methyl acetate, propylene glycol monomethyl ether, tetramethylfurane, dimethoxyethane and ethyl lactate. These organic solvents may be used either alone or in combination in a proper amount so as to impart the resin composition with a viscosity suitable for the coating.

The concentration of the epoxy resin composition prepared by blending the organic solvent is properly set in consideration of coating ease and is preferably, for example, 20 to 80 wt %.

<<Optical Waveguide>>

An optical waveguide will be described, which includes a cladding layer formed by using the optical waveguide forming epoxy resin composition. The optical waveguide forming epoxy resin composition is used for the cladding layer, but may be used for a core layer.

The optical waveguide to be obtained includes, for example, a substrate, a cladding layer (under-cladding layer) formed in a predetermined pattern on the substrate, a core layer formed in a predetermined pattern on the cladding layer for transmission of an optical signal, and a cladding layer (over-cladding layer) formed over the core layer. In the optical waveguide to be obtained, the cladding layer is formed from the optical waveguide forming epoxy resin composition. Particularly, the optical waveguide forming epoxy resin composition is preferably used as both an under-cladding layer forming material and an over-cladding layer forming material. In the optical waveguide to be obtained, the cladding layer is required to have a lower refractive index than the core layer.

Here, the glass transition temperature Tg of the (cured) cladding layer formed by using the optical waveguide forming epoxy resin composition preferably has a lower limit of not lower than 55° C., more preferably not lower than 60° C., and preferably has an upper limit of not higher than 150° C., more preferably not higher than 130° C. If the Tg is excessively low, a core resin component is liable to infiltrate into the under-cladding layer, so that light transmitted through the core layer leaks into the under-cladding layer, resulting in an increased waveguide loss. If the Tg is excessively high, the elastic modulus is liable to increase, resulting in poorer flexibility.

The (cured) cladding layer formed by using the optical waveguide forming epoxy resin composition preferably has a refractive index of not higher than 1.56, particularly preferably not higher than 1.55. The refractive index of the (cured) cladding layer is measured, for example, in the following manner. A (cured) cladding layer having a thickness of about 10 μm is formed on a smooth surface of a silicon wafer, and the refractive index of the cured cladding layer is measured at 850 nm by means of a prism coupler (SPA-4000) available from SAIRON TECHNOLOGY, Inc.

The optical waveguide is produced, for example, through the following steps. A substrate is prepared, and a photosensitive varnish prepared by using the optical waveguide forming epoxy resin composition is applied on the substrate. A photomask for exposure in a predetermined pattern (optical waveguide pattern) is provided on the resulting varnish coating film (under-cladding formation layer). Then, the under-cladding formation layer is irradiated with light such as ultraviolet radiation via the photomask and, as required, heat-treated to be thereby cured. Thereafter, an unexposed portion of the under-cladding formation layer is dissolved away with the use of a developing liquid. Thus, an under-cladding layer (a lower portion of a cladding layer) is formed as having the predetermined pattern.

In turn, a core layer forming material (varnish) is applied on the under-cladding layer to form a core formation layer. Then, a photomask for exposure in a predetermined pattern (optical waveguide pattern) is provided on the core formation layer. Subsequently, the core formation layer is irradiated with light such as ultraviolet radiation via the photomask and, as required, heat-treated. Thereafter, an unexposed portion of the core formation layer is dissolved away with the use of a developing liquid. Thus, a core layer is formed as having the predetermined pattern.

Subsequently, the over-cladding layer forming material is applied over the core layer. Then, the resulting over-cladding formation layer is irradiated with light such as ultraviolet radiation and, as required, heat-treated. Thus, an over-cladding layer (an upper portion of the cladding layer) is formed. Through these process steps, the intended optical waveguide is produced.

Exemplary materials for the substrate include a silicon wafer, a metal substrate, a polymer film and a glass substrate. Examples of the metal substrate include stainless steel plates such as of SUS. Specific examples of the polymer film include a polyethylene terephthalate (PET) film, a polyethylene naphthalate film and a polyimide film. The substrate typically has a thickness of 10 μm to 3 mm.

The light irradiation is, for example, irradiation with ultraviolet radiation. Exemplary light sources for the irradiation with the ultraviolet radiation include a low pressure mercury lamp, a high pressure mercury lamp and an ultrahigh pressure mercury lamp. The dose of the ultraviolet radiation is typically about 10 to about 20000 mJ/cm$^2$, preferably about 100 to about 15000 mJ/cm$^2$, more preferably about 500 to about 10000 mJ/cm$^2$.

After the exposure by the irradiation with the ultraviolet radiation, a heat treatment may be performed for completion of a photoreaction for the curing. Conditions for the heat treatment are typically a temperature of 80° C. to 250° C. and a period of 10 seconds to 2 hours, preferably a temperature of 100° C. to 150° C. and a period of 5 minutes to 1 hour.

Where the optical waveguide forming epoxy resin composition is used as the cladding layer forming material, a resin composition containing a solid multi-functional aromatic epoxy resin and a solid (viscous) fluorene-containing bi-functional epoxy resin and optionally any of the various photoacid generators described above is used as the core layer forming material. Where the core layer forming material is prepared in the form of a varnish for coating, the resin composition is mixed with a proper amount of an organic solvent so as to have a viscosity suitable for the coating.

Exemplary methods for application of each of the layer forming materials on the substrate include coating methods employing a spin coater, a coater, a round coater, a bar coater or the like, a screen printing method, a capillary injection method in which the material is injected into a gap formed with the use of spacers by the capillary phenomenon, and a continuous roll-to-roll coating method employing a coating machine such as a multi-coater. The optical waveguide may be provided in the form of a film optical waveguide by removing the substrate.

The optical waveguide thus produced can be used as an optical waveguide for a light transmission flexible printed board.

EXAMPLES

The present invention will be described by way of inventive examples thereof. However, it should be understood that the present invention be not limited to these inventive examples.

Inventive Example 1

Prior to production of an optical waveguide according to this example, photosensitive varnishes were prepared as a cladding layer forming material and a core layer forming material.

<Preparation of Cladding Layer Forming Material>

Under shaded conditions, 50 g of a liquid long-chain bi-functional semi-aliphatic epoxy resin (EXA-4816 available from DIC Corporation), 20 g of a solid multi-functional aliphatic epoxy resin (EHPE 3150 available from Daicel Chemical Industries Ltd.), 30 g of a liquid long-chain bi-functional aliphatic epoxy resin (PG-207N available from Nippon Steel Chemical Co., Ltd.) and 2.0 g of a photoacid generator (ADEKAOPTOMER SP-170 available from Adeka Corporation) were mixed with 20 g of ethyl lactate, and completely dissolved in ethyl lactate at 85° C. with heating. Then, the resulting mixture was cooled to a room temperature (25° C.), and then filtered under higher temperature and higher pressure conditions with the use of a membrane filter having a pore diameter of 1.0 μm. Thus, a photosensitive varnish was prepared as the cladding layer forming material.

<Preparation of Core Layer Forming Material>

Under shaded conditions, 50 g of a solid multi-functional aromatic epoxy resin (YDCN-700-10 available from Nippon Steel Chemical Co., Ltd.), 50 g of a solid (viscous) fluorene-containing bi-functional epoxy resin (OGSOL-EG-200 available from Osaka Gas Chemicals Co., Ltd.) and 2.0 g of a photoacid generator (ADEKAOPTOMER SP-170 available from Adeka Corporation) were mixed with 50 g of ethyl lactate, and completely dissolved in ethyl lactate at 85° C. with heating. Then, the resulting mixture was cooled to a room temperature (25° C.), and filtered under higher temperature and higher pressure conditions with the use of a filter having a pore diameter of 1.0 μm. Thus, a photosensitive varnish was prepared as the core layer forming material.

<Formation of Under-Cladding Layer>

The aforementioned photosensitive varnish as the cladding layer forming material was applied on a back surface of a flexible printed board substrate (FPC substrate) having an overall thickness of 22 μm by means of a spin coater, and then the organic solvent was dried on a hot plate (at 130° C. for 10 minutes), whereby an uncured under-cladding formation layer was formed. It is noted that, if the substrate is removed in this state, an optical waveguide forming curable film is provided.

The uncured under-cladding formation layer thus formed was exposed to light via a predetermined mask pattern (pattern width/pattern pitch (L/S)=50 μm/200 μm) by means of a UV irradiation machine (at 5000 mJ/cm$^2$ (with an I-line filter)), and then subjected to a post heat treatment (at 130° C. for 10 minutes). Thereafter, the resulting under-cladding formation layer was developed in γ-butyrolactone (at 25° C. for 3 minutes) and rinsed with water, and then dried on a hot plate (at 120° C. for 10 minutes) for removal of water. Thus, an under-cladding layer (having a thickness of 15 μm) was formed.

<Formation of Core Layer>

The aforementioned photosensitive varnish as the core layer forming material was applied on the thus formed under-cladding layer by means of a spin coater, and then the organic solvent was dried on a hot plate (at 130° C. for 5 minutes). Thus, a core formation layer was formed in an uncured film state. The uncured core formation layer thus formed was exposed to light via a predetermined mask pattern (pattern width/pattern pitch (L/S)=50 μm/200 μm) by means of a UV irradiation machine (at 9000 mJ/cm$^2$ (with an I-line filter)), and then subjected to a post heat treatment (at 130° C. for 10 minutes). Thereafter, the resulting core formation layer was developed in γ-butyrolactone (at 25° C. for 4 minutes) and rinsed with water, and then dried on a hot plate (at 120° C. for 10 minutes) for removal of water. Thus, a core layer (having a thickness of 50 μm) was formed as having the predetermined pattern.

<Formation of Over-Cladding Layer>

The aforementioned photosensitive varnish as the cladding layer forming material was applied over the thus formed core layer by means of a spin coater, and then the organic solvent was dried on a hot plate (at 130° C. for 10 minutes). Thus, an uncured over-cladding formation layer was formed. The uncured over-cladding formation layer thus formed was exposed to light by means of a UV irradiation machine (at 5000 mJ/cm$^2$ (with an I-line filter)), and then subjected to a post heat treatment (at 130° C. for 10 minutes). Thereafter, the resulting over-cladding formation layer was developed in γ-butyrolactone (at 25° C. for 3 minutes) and rinsed with water, and then dried on a hot plate (at 120° C. for 10 minutes) for removal of water. Thus, an over-cladding layer (having a thickness of 10 μm) was formed.

In this manner, an optical waveguide (having a thickness of 75 μm) was produced, which included the under-cladding layer formed on the FPC substrate, the core layer formed in the predetermined pattern on the under-cladding layer, and the over-cladding layer formed over the core layer.

Inventive Example 2

An optical waveguide was produced in substantially the same manner as in Inventive Example 1, except that, in the preparation of the photosensitive varnish as the cladding layer forming material, the formulation of the resin component was changed to include 60 g of the liquid long-chain bi-functional semi-aliphatic epoxy resin (EXA-4816 available from DIC Corporation), 20 g of the solid multi-functional aliphatic epoxy resin (EHPE 3150 available from Daicel Chemical Industries Ltd.) and 20 g of the liquid long-chain bi-functional aliphatic epoxy resin (PG-207N available from Nippon Steel Chemical Co., Ltd.)

Inventive Example 3

An optical waveguide was produced in substantially the same manner as in Inventive Example 1, except that, in the preparation of the photosensitive varnish as the cladding layer forming material, the formulation of the resin component was changed to include 70 g of the liquid long-chain bi-functional semi-aliphatic epoxy resin (EXA-4816 available from DIC Corporation), 20 g of the solid multi-functional aliphatic epoxy resin (EHPE 3150 available from Daicel Chemical Industries Ltd.) and 10 g of the liquid long-chain bi-functional aliphatic epoxy resin (PG-207N available from Nippon Steel Chemical Co., Ltd.)

Inventive Example 4

An optical waveguide was produced in substantially the same manner as in Inventive Example 1, except that, in the preparation of the photosensitive varnish as the cladding layer forming material, the formulation of the resin component was changed to include 80 g of the liquid long-chain bi-functional semi-aliphatic epoxy resin (EXA-4816 available from DIC Corporation) and 20 g of the solid multi-functional aliphatic epoxy resin (EHPE 3150 available from Daicel Chemical Industries Ltd.) and not to include the liquid long-chain bi-functional aliphatic epoxy resin (PG-207N available from Nippon Steel Chemical Co., Ltd.)

Comparative Example 1

An optical waveguide was produced in substantially the same manner as in Inventive Example 1, except that, in the preparation of the photosensitive varnish as the cladding layer forming material, the formulation of the resin component was changed to include 90 g of the liquid long-chain bi-functional semi-aliphatic epoxy resin (EXA-4816 available from DIC Corporation) and 10 g of the solid multi-functional aliphatic epoxy resin (EHPE 3150 available from Daicel Chemical Industries Ltd.) and not to include the liquid long-chain bi-functional aliphatic epoxy resin (PG-207N available from Nippon Steel Chemical Co., Ltd.)

Comparative Example 2

An optical waveguide was produced in substantially the same manner as in Inventive Example 1, except that, in the preparation of the photosensitive varnish as the cladding layer forming material, the formulation of the resin component was changed to include 40 g of the liquid long-chain bi-functional semi-aliphatic epoxy resin (EXA-4816 available from DIC Corporation), 20 g of the solid multi-functional aliphatic epoxy resin (EHPE 3150 available from Daicel Chemical Industries Ltd.) and 40 g of the liquid long-chain bi-functional aliphatic epoxy resin (PG-207N available from Nippon Steel Chemical Co., Ltd.)

Comparative Example 3

An optical waveguide was produced in substantially the same manner as in Inventive Example 1, except that, in the preparation of the photosensitive varnish as the cladding layer forming material, the formulation of the resin component was changed to include 40 g of the liquid long-chain bi-functional semi-aliphatic epoxy resin (EXA-4816 available from DIC Corporation), 30 g of the solid multi-functional aliphatic epoxy resin (EHPE 3150 available from Daicel Chemical Industries Ltd.) and 30 g of the liquid long-chain bi-functional aliphatic epoxy resin (PG-207N available from Nippon Steel Chemical Co., Ltd.)

Comparative Example 4

An optical waveguide was produced in substantially the same manner as in Inventive Example 1, except that, in the preparation of the photosensitive varnish as the cladding layer forming material, the formulation of the resin component was changed to include 30 g of the liquid long-chain bi-functional semi-aliphatic epoxy resin (EXA-4816 available from DIC Corporation), 40 g of the solid multi-functional aliphatic epoxy resin (EHPE 3150 available from Daicel Chemical Industries Ltd.) and 30 g of the liquid long-chain bi-functional aliphatic epoxy resin (PG-207N available from Nippon Steel Chemical Co., Ltd.)

Comparative Example 5

An optical waveguide was produced in substantially the same manner as in Inventive Example 1, except that, in the preparation of the photosensitive varnish as the cladding layer forming material, 50 g of a phenoxy resin (EPICOAT 1007 available from Mitsubishi Chemical Corporation) was used instead of 50 g of the liquid long-chain bi-functional semi-aliphatic epoxy resin (EXA-4816 available from DIC Corporation).

The optical waveguides thus produced were each evaluated for the glass transition temperature Tg, the refractive index, the linear loss, the bend loss, the flexibility and the patternability by performing measurement in the following manner. The results are shown together with the formulations of the respective cladding layer forming materials below in Table 1.

<Measurement of Glass Transition Temperature Tg>

The photosensitive varnishes prepared as the cladding layer forming materials in Inventive Examples and Comparative Examples were each applied on a 1.1 mm thick glass substrate by means of an applicator, and dried (at 130° C. for 10 minutes). The resulting uncured film was exposed to light at 5000 mJ/cm$^2$ (with an I-line filter), and then subjected to a post heat treatment (at 130° C. for 10 minutes) to provide a cured product. The cured product was separated from the glass substrate with the use of a cutter blade. The resulting cured film was used as a sample (having a thickness of 50 μm) for the measurement of the glass transition temperature Tg. The glass transition temperature Tg of the sample was determined based on a tan δ value by means of a dynamic viscoelasticity analyzer (RSA3 available from TA Instruments Ltd.)

<Refractive Index>

The photosensitive varnishes prepared as the cladding layer forming materials in Inventive Examples and Comparative Examples were each applied on a 0.8 mm thick silicon wafer by means of a spin coater, and dried (at 130° C. for 10 minutes). The resulting uncured film was exposed to light at 5000 mJ/cm$^2$ (with an I-line filter), and then subjected to a post heat treatment (at 130° C. for 10 minutes) to provide a cured film. The cured film was used as a sample (having a thickness of 10 μm) for the evaluation of the refractive index. The refractive index of the sample was measured at 850 nm by means of a prism coupler (SPA-4000) available from SAIRON TECHNOLOGY, Inc.)

<Linear Loss>

The optical waveguides produced in Inventive Examples and Comparative Examples were each used as a sample. Light emitted from a light source (850-nm VCSEL light source OP250 available from Miki Inc.) was collected and inputted into the sample by means of a multi-mode fiber (FFP-G120-0500 available from Miki Inc.) having an MMF diameter of 50 μm and an NA of 0.2. Then, light outputted from the sample was collected by a lens (FH14-11 available from Seiwa Optical Co., Ltd.) having a magnification of 20 and an NA of 0.4, and detected at 6 channels by a light measurement system (optical multi-power meter Q8221 available from Advantest Corporation) for evaluation. The sample was evaluated for the linear loss from an average total loss for the six channels based on the following criteria:

Acceptable (○): A sample having a total linear loss of not greater than 0.1 dB/cm Unacceptable (×): A sample having a total linear loss of greater than 0.1 dB/cm <Bend Loss>

The optical waveguides produced in Inventive Examples and Comparative Examples were each used as a sample. The sample was wound 360 degrees around a metal rod having a diameter of 2 mm, and light emitted from a light source (850-nm VCSEL light source OP250 available from Miki Inc.) was collected and inputted into the sample by means of a multi-mode fiber (FFP-G120-0500 available from Miki Inc.) having an MMF diameter of 50 μm and an NA of 0.2. Then, light outputted from the sample was collected by a lens (FH14-11 available from Seiwa Optical Co., Ltd) having a magnification of 20 and an NA of 0.4, and detected at 6 channels by a light measurement system (optical multi-power meter Q8221 available from Advantest Corporation) for evaluation. A difference between an average total loss for the six channels and the total linear loss determined in the aforementioned manner was calculated as the bend loss. Consequently, the sample was evaluated for the bend loss based on the following criteria:

Acceptable (○): A sample having a loss increased by not greater than 0.5 dB as compared with the initial value Unacceptable (×): A sample having a loss increased by greater than 0.5 dB as compared with the initial value <Flexibility>

The optical waveguides produced in Inventive Examples and Comparative Examples were each cut into a 50 mm piece, which was used as a sample for evaluation of the flexibility. An IPC slide test was performed on the sample with a bending radius r of 1.5 mm, a sliding distance of 20 mm and a sliding speed of 20 mm/sec. Consequently, the sample was evaluated based on the following criteria:

Acceptable (○): A sample free from breakage even after being bent 100,000 or more times Unacceptable (×): A sample suffering from breakage when being bent less than 100,000 times <Patternability>

The under-cladding layers formed in the predetermined pattern in Inventive Examples and Comparative Examples were each used as a sample. That is, the uncured under-cladding formation layer was exposed to light via the predetermined mask pattern (pattern width/pattern pitch (L/S)=50 μm/200 μm) by means of the UV irradiation machine (at 5000 mJ/cm$^2$ (with the I-line filter)), and then subjected to the post heat treatment (at 130° C. for 10 minutes). Thereafter, the resulting under-cladding formation layer was developed in γ-butyrolactone (at 25° C. for 3 minutes) and rinsed with water, and then dried on the hot plate (at 120° C. for 10 minutes) for removal of water. Thus, the sample (L/S=50 μm/200 μm) was formed for the evaluation of the patternability.

Excellent (○): A sample free from configurational abnormalities such as waviness, collapse and bottom expansion of the pattern Acceptable (Δ): A sample free from waviness and collapse of the pattern and suffering from bottom expansion of the pattern Unacceptable (×): A sample suffering from configurational abnormalities such as waviness, collapse and bottom expansion of the pattern

TABLE 1

|  | Inventive Example | | | | Comparative Example | | | | |
|---|---|---|---|---|---|---|---|---|---|
|  | 1 | 2 | 3 | 4 | 1 | 2 | 3 | 4 | 5 |
| Liquid epoxy resin (A) | | | | | | | | | |
| EXA-4816* | 50 | 60 | 70 | 80 | 90 | 40 | 40 | 30 | — |
| PG-207N | 30 | 20 | 10 | — | — | 40 | 30 | 30 | 30 |
| Solid resin (B) | | | | | | | | | |
| EHPE-3150 | 20 | 20 | 20 | 20 | 10 | 20 | 30 | 40 | 20 |
| EPICOAT 1007 | — | — | — | — | — | — | — | — | 50 |
| Photoacid generator (C) | | | | | | | | | |
| ADEKA OPTOMER SP-170 | 2 | 2 | 2 | 2 | 2 | 2 | 2 | 2 | 2 |
| Evaluation | | | | | | | | | |
| Tg (° C.) | 60 | 78 | 96 | 117 | 104 | 51 | 55 | 65 | 87 |
| Refractive index | 1.53 | 1.54 | 1.54 | 1.55 | 1.55 | 1.53 | 1.53 | 1.52 | 1.56 |
| Linear loss | ○ | ○ | ○ | ○ | ○ | × | × | ○ | ○ |
| Bend loss | ○ | ○ | ○ | ○ | × | ○ | ○ | ○ | × |
| Flexibility | ○ | ○ | ○ | ○ | ○ | ○ | ○ | × | × |
| Patternability | ○ | ○ | ○ | ○ | Δ | ○ | ○ | ○ | ○ |

*Liquid epoxy resin represented by Formula (1)

The above results indicate that a higher glass transition temperature Tg (60° C. or higher), excellent flexibility and excellent patternability were ensured in Inventive Examples in which the optical waveguides respectively included the cladding layers formed by using the photosensitive varnishes each containing the specific liquid epoxy resin in the specific proportion. In Inventive Examples, the increase in refractive index was suppressed, and the linear loss and the bend loss were acceptable. Thus, the optical waveguides of Inventive Examples were well-balanced in characteristic properties.

In Comparative Examples 2 to 5 in which the proportion of the specific liquid epoxy resin in the resin component was less than 50 wt %, in contrast, at least one of the linear loss, the bend loss and the flexibility was unsatisfactory. In Comparative Example 1 in which the proportion of the specific liquid epoxy resin in the resin component was greater than 90 wt %, the bend loss was unacceptable, and the patternability was poorer with the bottom expansion and other configurational abnormality of the pattern.

Although specific forms of embodiments of the instant invention have been described above in order to be more clearly understood, the above description is made by way of example and not as a limitation to the scope of the instant invention. It is contemplated that various modifications apparent to one of ordinary skill in the art could be made without departing from the scope of the invention.

The optical waveguide forming epoxy resin composition is useful as a material for forming a component of an optical waveguide, particularly as a cladding layer forming material. The optical waveguide produced by using the optical waveguide forming epoxy resin composition is used, for example, for a light transmission flexible printed board.

What is claimed is:

1. An optical waveguide forming epoxy resin composition, comprising:
    (A) a liquid epoxy resin;
    (B) a solid resin; and
    (C) a photoacid generator;
    wherein the liquid epoxy resin (A) comprises a liquid epoxy resin represented by the following general formula (1) as a major component thereof, said liquid epoxy resin represented by general formula (1) being present in a proportion of 50 to 80 wt % based on an overall amount of a resin component of the optical waveguide forming epoxy resin composition:

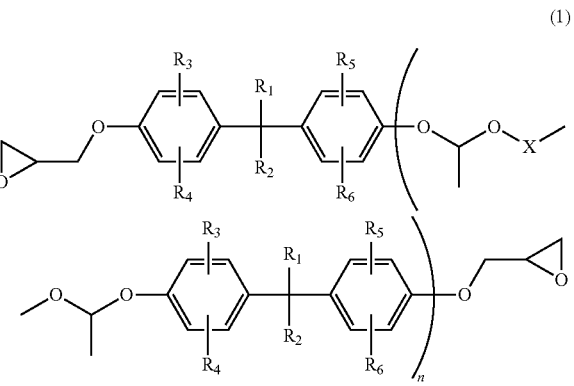

(1)

wherein $R_1$ and $R_2$ are each a hydrogen atom or a methyl group;
wherein $R_3$ to $R_6$ are each a hydrogen atom, a methyl group, a chlorine atom or a bromine atom;
wherein X is a $C_2$ to $C_{15}$ alkylene group, an ethyleneoxy group, a di(ethyleneoxy) group, a tri(ethyleneoxy) group, a propyleneoxy group, a propyleneoxypropyl group, a di(propyleneoxy)propyl group or a tri(propyleneoxy)propyl group; and
wherein n is a natural number and has an average value of 1.2 to 5.

2. An optical waveguide forming curable film comprising the optical waveguide forming epoxy resin composition as recited in claim 1.

3. A light transmission flexible printed board, comprising:
an optical waveguide including a clad and a core, at least one of the clad and core is formed by curing an optical waveguide forming epoxy resin composition as recited in claim 1.

4. A light transmission flexible printed board, comprising:
an optical waveguide including a clad and a core, at least one of the clad and core is formed by curing an optical waveguide forming curable film as recited in claim 2.

5. An optical waveguide forming epoxy resin composition recited in claim 1, further comprising other liquid epoxy resin than the liquid epoxy resin (A).

6. An optical waveguide forming epoxy resin composition recited in claim 5, wherein the other liquid epoxy resin is at least one selected from the group consisting of a liquid bisphenol-A epoxy resin, a liquid bisphenol-F epoxy resin, a liquid hydrogenated bisphenol-A epoxy resin, a liquid 3,4-epoxycyclohexenylmethyl-3',4'-epoxycyclohexene carboxylate and a liquid 3,4-epoxycyclohexenylmethyl-3',4'-epoxycyclohexene carboxylate modified with ϵ-caprolactone.

7. An optical waveguide forming epoxy resin composition recited in claim 1, wherein the solid resin (B) is at least one selected from the group consisting of a solid 1,2-epoxy-4-(2-oxiranyl)cyclohexane adduct of 2,2-bis(hydroxymethyl)-1-butanol, a solid bisphenol-A epoxy resin, a solid bisphenol-F epoxy resin and a solid hydrogenated bisphenol-A epoxy resin and a polyvinyl acetal resin.

8. An optical waveguide forming epoxy resin composition recited in claim 1, wherein said liquid epoxy resin represented by general formula (1) is present in a proportion of 60 to 70 wt % based on an overall amount of the resin component of the optical waveguide forming epoxy resin composition.

* * * * *